United States Patent
Hong et al.

(10) Patent No.: US 8,936,181 B2
(45) Date of Patent: Jan. 20, 2015

(54) VALVE ACCELERATING TYPE DISPENSING PUMP

(71) Applicant: Protec Co., Ltd., Incheon (KR)

(72) Inventors: Seung Min Hong, Incheon (KR); Il Kang, Gwangju (KR)

(73) Assignee: Protec Co., Ltd., Incheon (KR)

( * ) Notice: Subject to any disclaimer, the term of this patent is extended or adjusted under 35 U.S.C. 154(b) by 13 days.

(21) Appl. No.: 13/725,720

(22) Filed: Dec. 21, 2012

(65) Prior Publication Data

US 2013/0315764 A1    Nov. 28, 2013

(30) Foreign Application Priority Data

May 24, 2012   (KR) ........................ 10-2012-0055122

(51) Int. Cl.
*H01L 21/00* (2006.01)
*B05B 1/30* (2006.01)
*F04B 7/00* (2006.01)

(52) U.S. Cl.
CPC .................................. *F04B 7/0061* (2013.01)
USPC ............. 222/559; 222/63; 222/333; 222/340; 222/409; 222/504; 222/404; 156/578; 239/583; 118/300

(58) Field of Classification Search
CPC ..................... H01L 21/6715; H01L 21/67011; H01L 21/67005; H01L 21/67; B05C 5/02; B05C 5/0291; B05C 5/0225; F04B 7/0061
USPC ........... 222/63, 256, 262–263, 251, 333, 340, 222/380, 409, 504, 559, 404; 118/330, 323, 118/300; 156/578; 239/583, 584
See application file for complete search history.

(56) References Cited

U.S. PATENT DOCUMENTS

| | | | |
|---|---|---|---|
| 3,152,726 A * | 10/1964 | Chivers .......................... 222/60 |
| 4,430,886 A | 2/1984 | Rood | |
| 5,114,752 A | 5/1992 | Hall | |
| 5,255,827 A | 10/1993 | Breault et al. | |
| 5,261,610 A | 11/1993 | Warya et al. | |
| 5,671,873 A * | 9/1997 | Hammerl et al. ............. 222/309 |
| 6,010,740 A | 1/2000 | Rutledge et al. | |
| 8,353,429 B2 * | 1/2013 | Zhou et al. ................. 222/181.2 |
| 2013/0048759 A1 | 2/2013 | Aguilar et al. | |

FOREIGN PATENT DOCUMENTS

| | | |
|---|---|---|
| KR | 10-2005-0093935 A | 9/2005 |
| KR | 10-2010-0045678 A | 5/2010 |

* cited by examiner

*Primary Examiner* — Kevin P Shaver
*Assistant Examiner* — Nicholas J Weiss
(74) *Attorney, Agent, or Firm* — Knobbe Martens Olson & Bear LLP

(57) ABSTRACT

A dispensing pump, and more particularly, a valve accelerating type dispensing pump that may be used in a process of manufacturing an electronic product and may dispense an accurate amount of a liquid, such as a liquid synthetic resin, at high speed. The present invention provides a valve accelerating type dispensing pump that can descend a valve rod at high speed and thus can dispense a liquid with high viscosity at high speed. The valve accelerating type dispensing pump can dispense an accurate amount of a liquid at high speed. Also, the valve accelerating type dispensing pump can dispense a liquid having high viscosity at high speed due to a fast descending speed of a valve rod.

11 Claims, 8 Drawing Sheets

VALVE ACCELERATING TYPE DISPENSING PUMP

CROSS-REFERENCE TO RELATED PATENT APPLICATION

This application claims the benefit of Korean Patent Application No. 10-2012-0055122, filed on May 24, in the Korean Intellectual Property Office, the disclosure of which is incorporated herein in its entirety by reference.

BACKGROUND OF THE INVENTION

1. Field of the Invention

The present invention relates to a dispensing pump, and more particularly, to a valve accelerating type dispensing pump that is used in a process of manufacturing an electronic product and may dispense an accurate amount of a liquid, such as a liquid synthetic resin, at high speed.

2. Description of the Related Art

Pumps for dispensing liquid are used in various technical fields, such as processes of manufacturing electronic products by using semiconductor chips, and the like.

In particular, dispensing pumps are widely used in an underfill process of a semiconductor process. The underfill process is usually used in a surface mounting technique, such as a flip chip in which a plurality of metal balls are formed on a surface facing a substrate and which electrically connects the substrate and a semiconductor chip via the plurality of metal balls. If a liquid synthetic resin is applied onto a circumference of the semiconductor chip, the resin is dispersed into a space between the semiconductor chip and the substrate by a capillary phenomenon and is filled in a space between the metal balls. The resin that fills the space between the semiconductor chip and the substrate is hardened so that adhesive strength between the semiconductor chip and the substrate can be improved. In addition, the hardened resin serves as a shock absorber and dissipates heat generated in the semiconductor chip.

A function of dispensing a liquid at high speed of such dispensing pumps becomes significant. Korean Patent Laid-open Publication Nos. 10-2005-0093935 and 10-2010-0045678 disclose a structure of a pump for dispensing a resin by ascending/descending a valve due to interaction between a cam and a cam follower. Such dispensing pumps according to the related art have excellent performance but have a limitation in speed at which a valve rod descends due to a structure of cam protrusions of a cam member and a structure of a roller. Thus, there are some difficulties in dispensing the liquid at high speed, and in particular, it is difficult to dispense a liquid with high viscosity at high speed.

SUMMARY OF THE INVENTION

The present invention provides a valve accelerating type dispensing pump that may descend a valve rod at high speed and thus may dispense a liquid with high viscosity at high speed.

According to an aspect of the present invention, there is provided a valve accelerating type dispensing pump including: a pump body; a valve body including an inlet path on which a liquid from an outside is supplied, a reservoir in which the liquid supplied via the inlet path is stored, and a discharge path on which the liquid stored in the reservoir is discharged, the valve body being installed at the pump body; a valve rod pressurizing the liquid stored in the reservoir of the valve body and inserted in the reservoir of the valve body so that the liquid is discharged via the discharge path; an operating rod connected to the valve rod and driving the valve rod to move relative to the valve body; a cam member including a through hole through which the operating rod passes and cam protrusions formed along a circumferential direction of the cam member based on the through hole and having inclined surfaces formed so that a height of the cam protrusions increases, the cam member being installed at the pump body so that the cam member rotates around the through hole; a rotating unit rotating the cam member; a cam follower including rollers that roll on the inclined surfaces of the cam protrusions when the cam member rotates, the cam follower coupled to the operating rod and driving the valve rod to move relative to the valve body; an accelerating member assembled with the cam follower to allow relative rotation of the cam follower within a predetermined angle range and installed at the pump body so as to make a linear motion approaching the cam member; and an elastic member installed between the pump body and the accelerating member and providing an elastic force to the accelerating member so that the accelerating member approaches the cam member.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings in which exemplary embodiments of the invention are shown.

Figure 1:
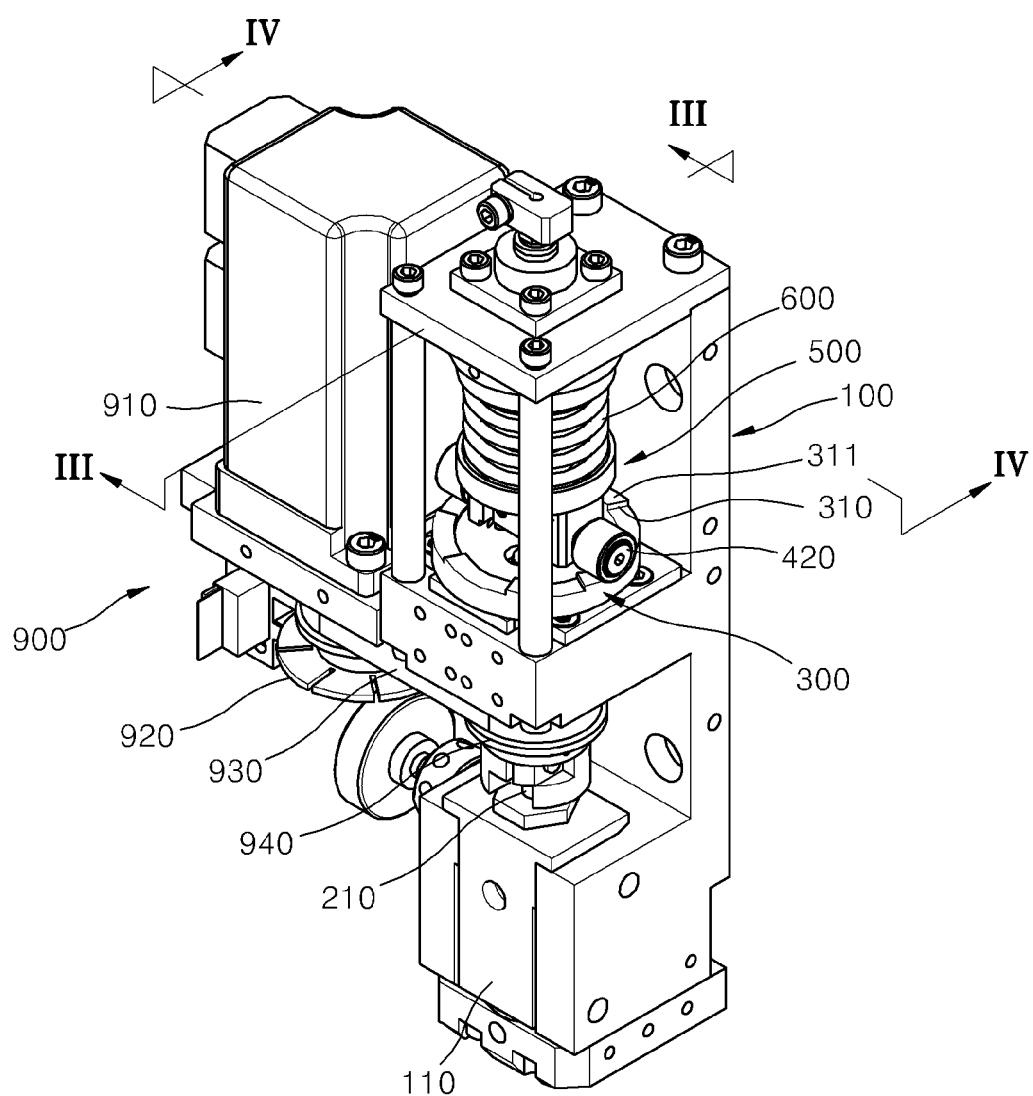
FIG. 1 is a perspective view of a valve accelerating type dispensing pump according to an embodiment of the present invention.
Figure 2:
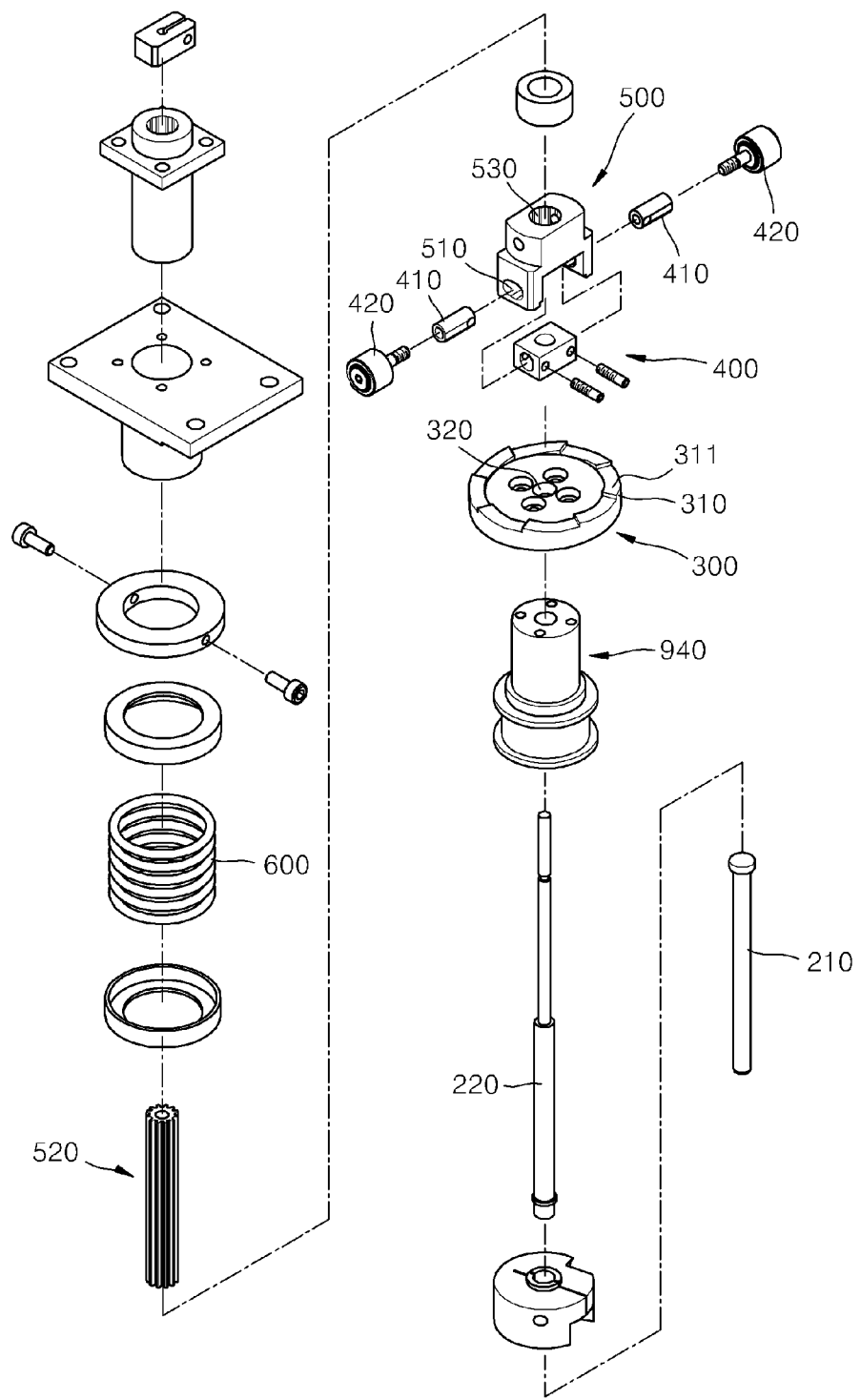
FIG. 2 is an exploded perspective view of main elements of the valve accelerating type dispensing pump illustrated in FIG. 1.
Figure 3:
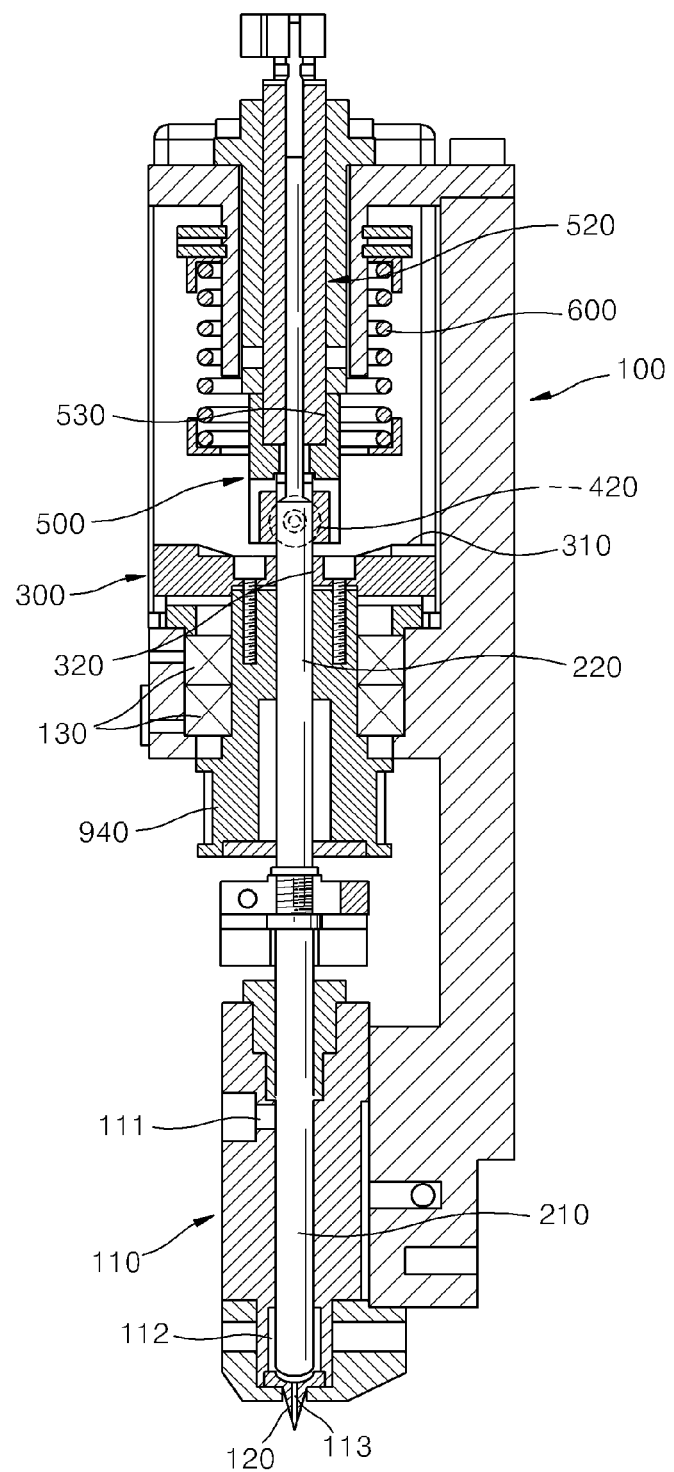
FIG. 3 is a cross-sectional view taken along a line of the valve accelerating type dispensing pump of FIG. 1.

FIG. 1 is a perspective view of a valve accelerating type dispensing pump according to an embodiment of the present invention, FIG. 2 is an exploded perspective view of main elements of the valve accelerating type dispensing pump illustrated in FIG. 1, and FIG. 3 is a cross-sectional view taken along a line III-III of the valve accelerating type dispensing pump of FIG. 1.

Referring to FIGS. 1 through 3, the valve accelerating type dispensing pump according to the present embodiment includes a pump body 100, a valve body 110, a valve rod 210, an operating rod 220, a cam member 300, and a cam follower 400.

The pump body 100 serves as a housing that supports the entire structure of the valve accelerating type dispensing pump. The pump body 100 is installed at a transfer device and is moved by the transfer device to allow a liquid to be dispensed.

The valve body 110 is installed at the pump body 100. The valve body 110 includes an inlet path 111, a reservoir 112, and a discharge path 113. The liquid stored in an external syringe (not shown) flows to the reservoir 112 via the inlet path 111. The liquid stored in the reservoir 112 is discharged via the discharge path 113 due to an operation of the valve rod 210 that ascends/descends with respect to the reservoir 112. A nozzle 120 is connected to the discharge path 113 so as to adjust dispensing characteristics of the liquid.

The valve rod 210 is inserted in the reservoir 112 and pressurizes the liquid stored in the reservoir 112 so as to discharge the liquid via the discharge path 113.

The cam member 300 is disposed above the valve body 110 and the valve rod 210 and is installed at the pump body 100. The cam member 300 is installed at the pump body 100 so as to rotate around a virtual central axis that extends in a lengthwise direction of the valve rod 210. A bearing 130 is installed between the cam member 300 and the pump body 100 so that the cam member 300 may rotate with respect to the pump body 100.

The cam member 300 rotates by a rotating unit 900. The rotating unit 900 includes a motor 910, a driving pulley 920, a timing belt 930, and a driven pulley 940. The motor 910 is installed at the pump body 100, and the driven pulley 940 is installed at the cam member 300. The timing belt 930 connects the driving pulley 920 and the driven pulley 940. If the motor 910 rotates the driving pulley 920, the driven pulley 940 rotates due to the timing belt 930. As a result, the cam member 300 rotates.

Figure 5A:
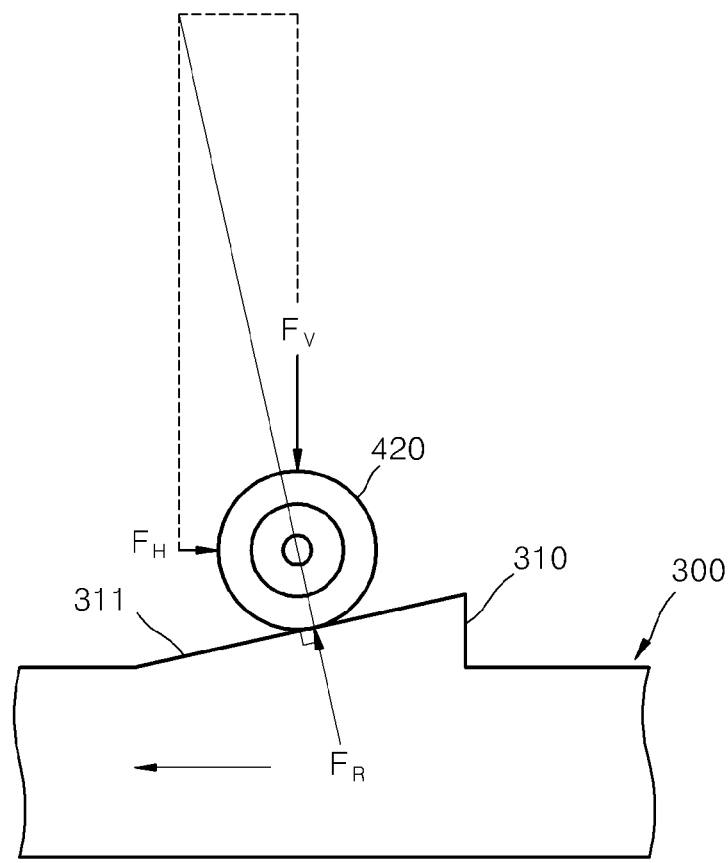
FIGS. 5A, 5B, 6A, 6B, 7A, and 7B are schematic views for explaining an operation of the valve accelerating type dispensing pump of FIG. 1.
Figure 5B:
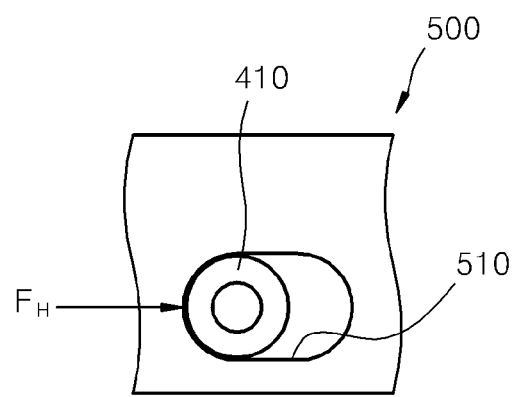

The cam member 300 includes a through hole 320 and a plurality of cam protrusions 310. The through hole 320 is formed to penetrate the center of the disc-shaped cam member 300 in a vertical direction. The plurality of cam protrusions 310 are arranged in a circumferential direction of the cam member 300 so that eight cam protrusions 310 are at the same angle intervals (i.e., at intervals of 45 degrees). The cam protrusions 310 are inclined in the same rotation direction along the circumferential direction of the cam member 300. That is, the cam protrusions 310 include inclined surfaces 311 that are inclined so that the height of the cam protrusions 310 may increase gradually clockwise, as illustrated in FIG. 2. Cross-sections of the cam protrusions 310 may be formed so that the inclined surfaces 311 are steeply bent from their tops to lower portions. In the present embodiment, the inclined surfaces 311 of the cam protrusions 310 are formed to be bent from their tops in the vertical direction, as illustrated in FIGS. 2, 5A, and 5B.

The operating rod 220 is disposed in the through hole 320 of the cam member 300 and is coupled to the valve rod 210. The operating rod 220 is coupled to the cam follower 400 and ascends or descends and drives the valve rod 210 to be moved up and down relative to the valve body 110.

The cam follower 400 faces a surface on which the cam protrusions 310 of the cam member 300 are formed and ascends/descends with respect to the cam member 300 due to interaction between the cam protrusions 310 and the cam follower 400. The cam follower 400 includes two rollers 420 that roll on the inclined surfaces 311 of the cam protrusions 310. Two rollers 420 of the cam follower 400 are disposed at intervals of 180 degrees.

The cam follower 400 is assembled with an accelerating member 500 and is installed at the pump body 100. The accelerating member 500 includes a spline boss 530 and is coupled to the pump body 100 via a spline shaft 520 so as to make a linear motion (ascending/descending motion in the present embodiment) approaching the cam member 400 and not to allow relative rotation of the cam follower 400. An elastic member 600 is disposed between the accelerating member 500 and the pump body 100 and provides an elastic force so that the elastic member 600 may be moved relative to the accelerating member 500 to approach the cam member 300. In the present embodiment, the elastic member 600 having a shape of a spring 600 is used. The cam follower 400 that is disposed between the accelerating member 500 and the cam member 300, receives the elastic force of the elastic member 600 from the accelerating member 500 and is maintained to be closely adhered to the cam member 300.

The accelerating member 500 and the cam follower 400 are assembled with each other so that they may rotate relative to each other within a predetermined angle range. Due to interaction between accelerating protrusions 410 formed on the cam follower 400 and angle limiting portions 510 formed on the accelerating member 500, the accelerating member 500 and the cam follower 400 may be rotated relative to each other within the predetermined angle range. In the present embodiment, the angle limiting portions 510 are long holes that extend in the circumferential direction of the accelerating member 500. Two angle limiting portions 510 having a shape of long holes face each other in a state where a central axis (operating rod 220) of the cam follower 400 is interposed between two angle limiting portions 510. The accelerating protrusions 410 of the cam follower 400 are formed in the form of rods that extend in a radial direction of the cam follower 400 and protrude from the cam follower 400. Like the angle limiting portions 510, two accelerating protrusions 410 are disposed and face each other in a state where the central axis of the cam follower 400 is interposed between two accelerating protrusions 410. The accelerating protrusions 410 are respectively inserted in the angle limiting portions 510 of the accelerating member 500. Since the accelerating protrusions 410 are caught in inner walls of the angle limiting portions 510, the cam follower 400 rotates with respect to the accelerating member 500 within an angle range that is allowed by the angle limiting portions 510. That is, a relative rotational angle of the cam follower 400 with respect to the accelerating member 500 is limited by interference between the accelerating protrusions 410 and the angle limiting portions 510. A range of the relative rotational angle of the cam follower 400 with respect to the accelerating member 500 that is limited by interaction between the accelerating protrusions 410 and the angle limiting portions 510 may be greater than 0 degree and less than angle intervals between the cam protrusions 310. In the present embodiment, a rotatable angle of the cam follower 400 may be greater than 0 degree and less than 90 degrees. The rollers 420 are installed at ends of the accelerating protrusions 410 according to the present embodiment and roll on the inclined surfaces 311 of the cam protrusions 310 of the cam member 300.

Hereinafter, an operation of the valve accelerating type dispensing pump having the above structure of FIGS. 1 through 3 will be described.

Figure 4:
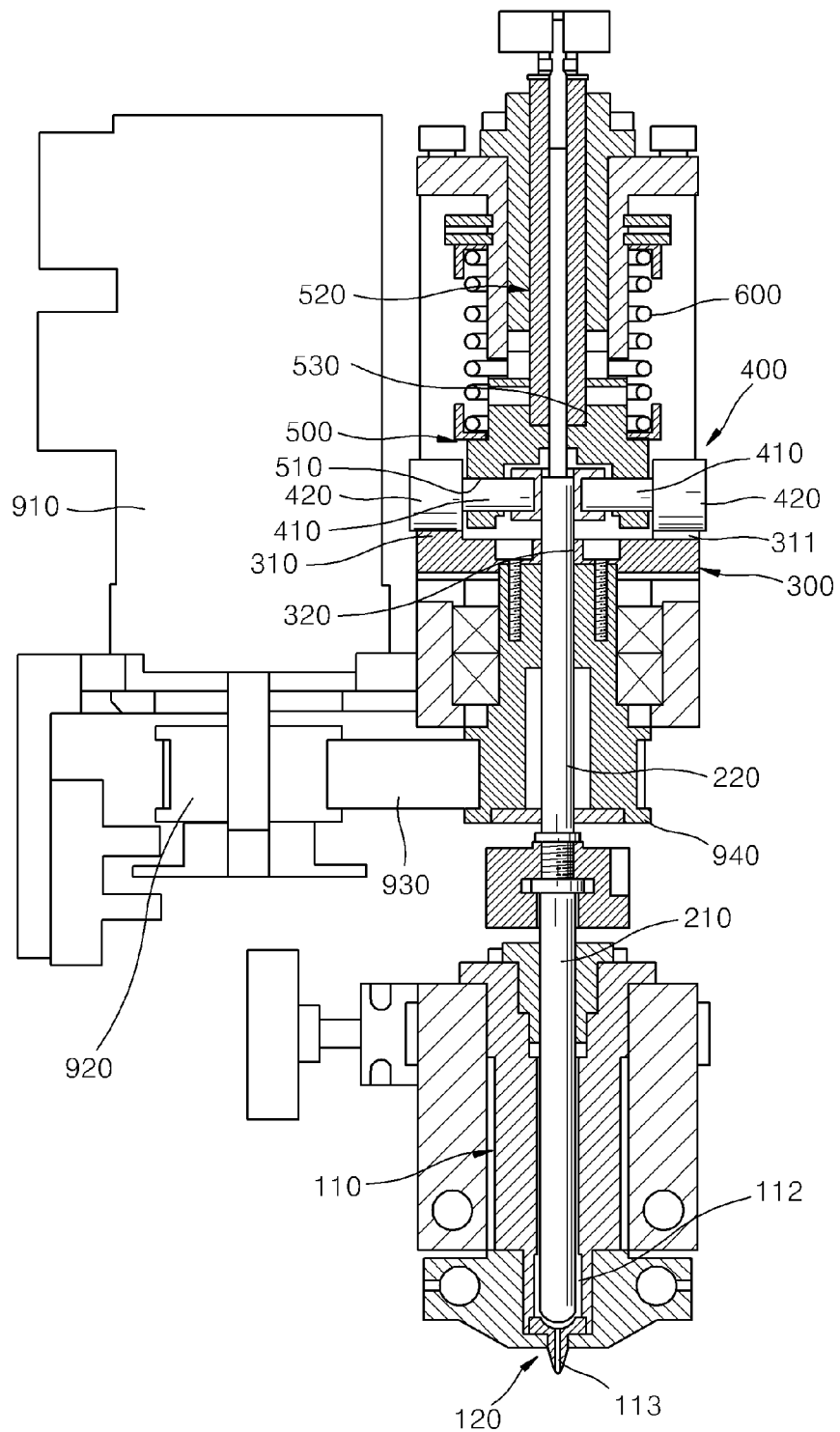
FIG. 4 is a cross-sectional view taken along a line IV-IV of the valve accelerating type dispensing pump of FIG. 1.

FIG. 4 is a cross-sectional view taken along a line IV-IV of the valve accelerating type dispensing pump of FIG. 1, and FIGS. 5A, 5B, 6A, 6B, 7A, and 7B are schematic views for explaining an operation of the valve accelerating type dispensing pump of FIG.

Referring to FIG. 4, the liquid stored in the external syringe flows to the reservoir 112 of the valve body 110 via the inlet path 111 under uniform pressure.

If the motor 910 operates in this state, the motor 910 rotates with the driving pulley 920, and the driven pulley 940 that is connected to the driving pulley 920 via the timing belt 930, also rotates. The cam member 300 that is coupled to the driven pulley 940 rotates with the driven pulley 940.

If the cam member 300 rotates, the rollers 420 of the cam follower 400 roll along the inclined surfaces 311 of the cam protrusions 310, and the cam follower 400 ascends. Since the accelerating member 500 is spline-coupled to the pump body 100 via the spline shaft 520, the accelerating member 500 does not rotate but the rollers 420 roll along the inclined surfaces 311 of the cam protrusions 310 so that the accelerating member 500 and the cam follower 400 ascend. When the accelerating member 500 ascends, the elastic member 600 is pressurized while applying the elastic force to the accelerating member 500 in a downward direction. Due to the elastic force of the elastic member 600, the rollers 420 of the cam follower 400 are maintained in contact with a top surface of the cam member 300. The operating rod 220 that is coupled to the cam follower 400, ascends with the valve rod 210. When the valve rod 210 ascends, the liquid flows in a space formed in the reservoir 112, and the space is filled with the liquid.

Referring to FIGS. 1, 5A, and 5B, when the cam member 300 rotates, the accelerating protrusions 410 of the cam follower 400 are slid along the angle limiting portions 510 of the accelerating member 500 and are caught in left walls of the angle limiting portions 500 based on FIGS. 5A and 5B. Thus, rotation of the cam follower 400 does not proceed any more. That is, even when the cam member 300 rotates, the cam follower 400 does not rotate with respect to the accelerating member 500. A concept of a state of force balance between the cam follower 400 and the cam member 300 is as shown in FIGS. 5A and 5B. A vertical resistance $F_R$ applied to the rollers 420 on the inclined surfaces 311 of the cam protrusions 310 is balanced with a horizontal component force $F_H$ and a vertical component force $F_V$ that are applied to the rollers 420. The vertical component force $F_V$ is provided by the elastic member 600 and is transferred to the rollers 420 via the accelerating member 500. The horizontal component force $F_H$ is transferred to the rollers 420 via the pump body 100—the accelerating member 500—the cam follower 400, because the accelerating protrusions 410 are caught in the angle limiting portions 510.

Figure 6A:
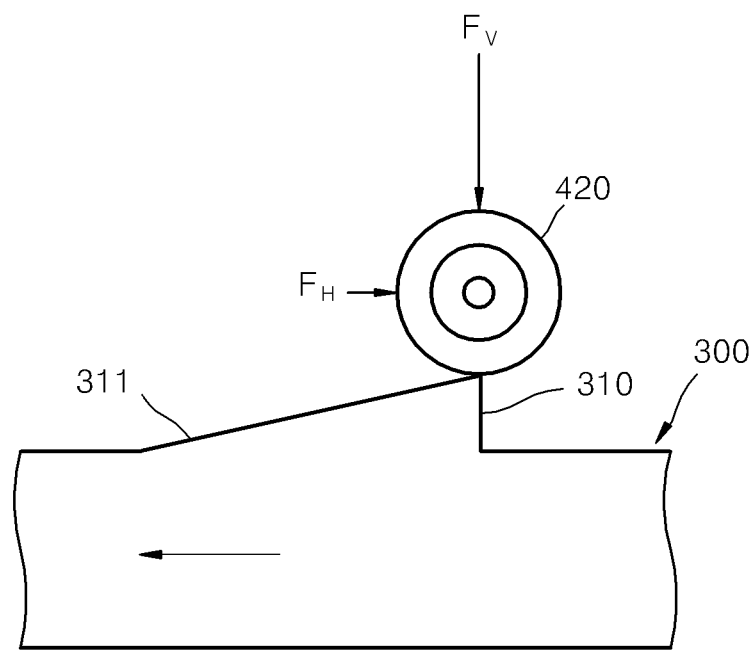
Figure 6B:
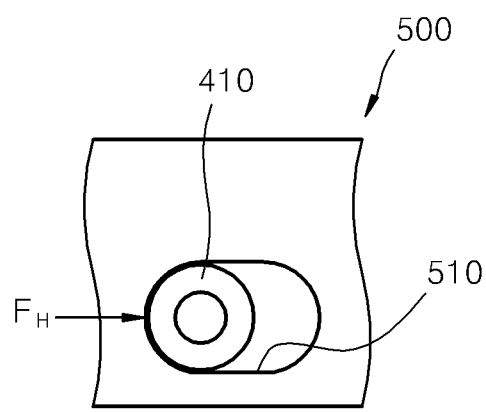
Figure 7A:
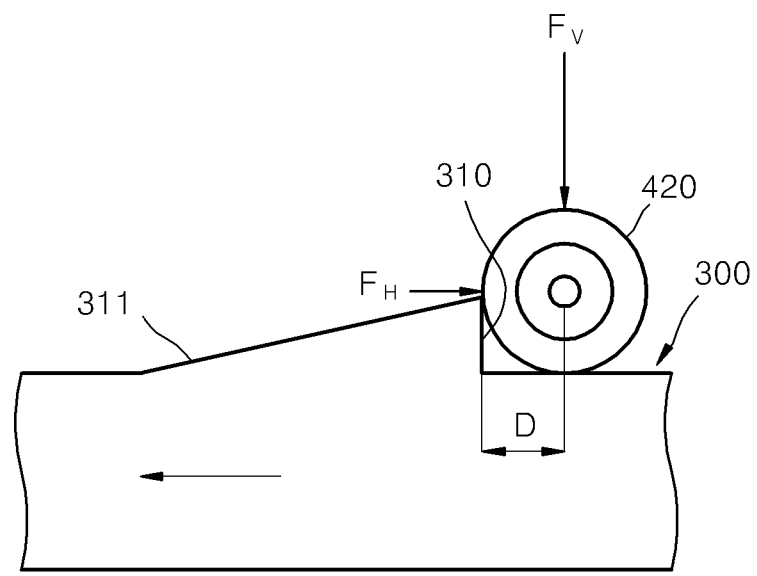
Figure 7B:
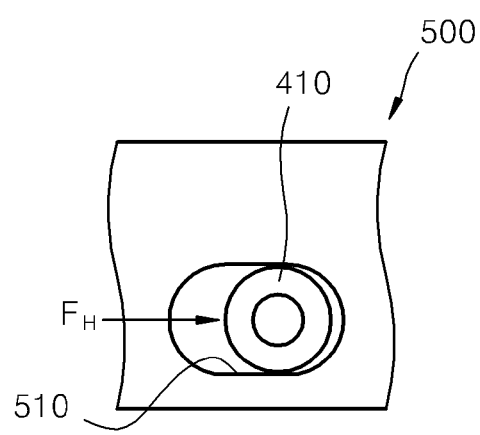

If the rollers 420 roll up to tops of the inclined surfaces 311 of the cam protrusions 310 and ascend, the horizontal component of the vertical resistance $F_R$ that is balanced with the horizontal component force $F_H$ applied to the rollers 420 becomes extinct, as illustrated in FIGS. 6A and 6B. That is, on the inclined surfaces 311 of the cam protrusions 310, a force is applied to the rollers 420 in the horizontal direction, and any force other than a frictional force is not applied to the rollers 420 in the vertical direction. As a result, due to the horizontal component force $F_H$ applied by the angle limiting portions 510 to the accelerating protrusions 410, the rollers 420 bounce off the cam protrusions 310 in the circumferential direction (right direction in FIGS. 5A, 5B, 6A, 6B, 7A, and 7B) of the cam member 300, as illustrated in FIGS. 7A and 7B. As described above, since the cam follower 400 may rotate with respect to the accelerating member 500 within the angle range that is allowed by the angle limiting portions 510, the cam follower 400 rotates with respect to the accelerating member 500 that does not rotate, in an opposite direction to a rotation direction of the cam member 300, and the rollers 420 escape from the tops of the cam protrusions 310 at high speed. In this case, due to the elastic force of the elastic member 600, the accelerating member 500, the cam follower 400, the operating rod 220, and the valve rod 210 descend. As a result, the liquid filled in the reservoir 112 is pressurized by the valve rod 210 and is discharged via the discharge path 113.

If the cam member 300 rotates consecutively and the rollers 420 ascend and descend along the cam protrusions 310 repeatedly, the valve rod 210 ascends and descends consecutively so that the liquid may be discharged via the discharge path 113.

In the above liquid-pumping mechanism, the descending speed of the valve rod 210 greatly affects the discharge amount and discharge speed of the liquid. In order to adjust an accurate discharge amount, an inner diameter of the discharge path 113 may be relatively small. As the descending speed of the valve rod 210 increases, the liquid having high viscosity may be quickly dispensed via the discharge path 113 having a small inner diameter. In particular, when the viscosity of the liquid is high, if the descending speed of the valve rod 210 is not sufficiently high, due to resistance caused by viscosity and resistance of the discharge path 113, the liquid may not be discharged. However, like in the present invention, the accelerating member 500 is used so that a liquid having high viscosity may be dispensed. In this way, by using the valve accelerating type dispensing pump according to the present invention, the range of the liquid that may be dispersed, may be greatly increased.

When there is no interaction between the accelerating protrusions 410 and the angle limiting portions 510 as described above, the descending speed of the valve rod 210 is determined by a rotational speed of the cam member 300. As illustrated in FIGS. 6A and 6B, the rollers 420 should roll toward the cam member 300 by a distance D indicated in FIG. 7A so that the rollers 420 may be moved from the tops of the cam protrusions 310 to the lowermost portion of the top surface of the cam member 300, as illustrated in FIGS. 7A and 7B. In a valve dispensing pump having no accelerating member including angle limiting portions according to the related art, since a cam member should rotate in a state where a cam follower is fixed and rollers should roll up to a bottom surface of the cam member, the descending speed of the valve rod is determined by the rotational speed of the cam member. Even when an elastic member that provides a strong elastic force is used, the descending speed of the valve rod is substantially determined by the rotational speed of the cam member rather than the elastic force of the elastic member. In particular, when an outer diameter of each roller increases, a distance that is required for the rollers to contact the lowermost portion of the top surface of the cam member, increases so that the descending speed of the valve rod is also decreased by the distance.

However, in the valve accelerating type dispensing pump according to the present embodiment, when the rollers 420 roll along the inclined surfaces 311 of the cam protrusions 310, the angle limiting portions 510 push the accelerating protrusions 410 in an opposite direction to the rotation direction of the cam member 300 by using the horizontal component force $F_H$ applied to the rollers 420, as illustrated in FIGS. 6A and 6B. The cam follower 400 rotates with respect to the accelerating member 500 due to a force applied by the angle limiting portions 510 to the accelerating protrusions 410 and rotates instantaneously in an opposite direction to the rotation direction of the cam member 300, as illustrated in FIGS. 7A and 7B. As a result, the rollers 420 and the cam member 300 are moved in opposite directions, and the rollers 420 roll at much higher speed compared to the related art by the distance D at which the rollers 420 contact the lowermost portion of the top surface of the cam member 300. Even when the rollers 420 having a relatively large outer diameter are used, due to interaction between the accelerating protrusions 410 and the angle limiting portions 510, the rollers 420 may be moved relative to the cam member 300 at high speed, and the valve rods 210 may descend due to the elastic member 600 at very high speed. Since the momentum and kinetic energy of the valve rod 210 are proportional to a descending speed of the valve rod 210 and a square of the descending speed, the liquid may be dispensed at much higher speed compared to the related art. In particular, a liquid having high viscosity may be dispensed by a sufficient force via the discharge path 113 having a relatively small inner diameter.

If the rollers 420 contact next cam protrusion 310, the cam follower 400 that rotates with respect to the accelerating member 500 in an opposite direction to the cam member 300, rotates in the same direction as the rotation direction of the cam protrusions 310 due to the vertical resistance $F_R$ of the cam protrusions 310, and the accelerating protrusions 410 are caught in the angle limiting portions 510 in a progressive direction. When the angle range of the angle limiting portions 510 is less than the angle range between the cam protrusions 310, the accelerating protrusions 410 are first caught in inner walls of the angle limiting portions 510, and rotation of the cam follower 400 with respect to the accelerating member 500 stops. If the rollers 420 contact next cam protrusion 310, the cam follower 400 rotates in the same direction as the cam member 300 so that the accelerating protrusions 410 are caught in opposite inner walls of the angle limiting portions 510 and rotation of the cam follower 400 stops.

To sum up, in the related art, even when an elastic force of an elastic member is strong, the descending speed of the valve rod is determined by the size of an outer diameter of a roller and a rotational speed of a cam member. However, in the valve accelerating type dispensing pump according to the present invention, due to interaction between the angle limiting portions 510 and the accelerating protrusions 410, the descending speed of the valve rod 210 may be increased using a sufficient elastic force of the elastic member 600.

Although embodiments of the present invention have been described as above, the scope of the present invention is not limited to the above-described embodiments.

For example, the accelerating protrusions 410 are formed on the cam follower 400, and the angle limiting portions 510 are formed on the accelerating member 500. However, the accelerating protrusions 410 may be formed on the accelerating member 500, and the angle limiting portions 510 may be formed on the cam follower 400.

Also, a bearing that rolls along the inner walls of the angle limiting portion 510 may be installed at the accelerating protrusions 410 so as to reduce friction between the accelerating protrusion 410 and the angle limiting portion 510.

In addition, the angle limiting portions 510 have the shape of long holes, as described above. However, the angle limiting portions 510 may also be formed in the form of long grooves. The accelerating protrusions 410 and the angle limiting portions 510 may be formed in various shapes in which the accelerating member 500 and the cam follower 400 may rotate relative to each other within a predetermined angle range due to interference between the accelerating protrusions 410 and the angle limiting portions 510.

Furthermore, the rollers 420 are installed at the accelerating protrusions 410, as described above. However, the rollers 420 may be configured in different ways. The accelerating protrusions 410 interfere with the angle limiting portions 510 independently from the rollers 420 so that the rotational angle of the cam follower 400 may be limited, and the rollers 420 may be configured to be coupled to the cam follower 400 separately from the accelerating protrusions 410.

Figure 8:
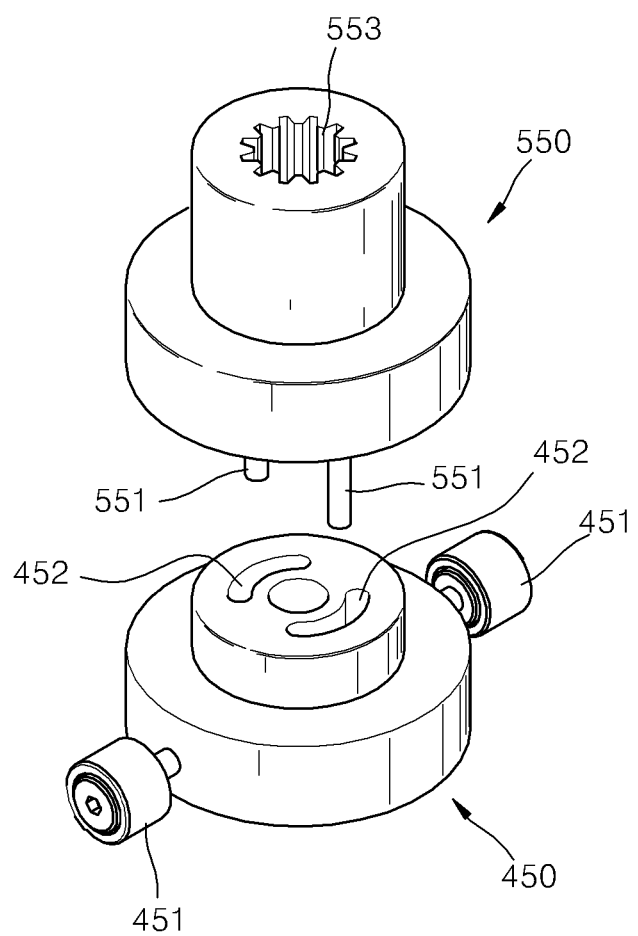
FIG. 8 is an exploded perspective view of main elements of a valve accelerating type dispensing pump according to another embodiment of the present invention.

FIG. 8 illustrates another example of accelerating protrusions 551 and angle limiting portions 452.

The accelerating protrusions 551 are formed on an accelerating member 550, and the angle limiting portions 452 are formed on a cam follower 450. The angle limiting portions 452 of the cam follower 450 are formed in the form of long grooves having a circular arc shape on a surface that faces the accelerating member 550 along a circumferential direction of the accelerating member 550. The accelerating protrusions 551 of the accelerating member 550 are formed in the form of rods that extend in a bottom surface of the accelerating member 550 and are inserted in the angle limiting portions 452 of the cam follower 450. The cam follower 450 rotates with respect to the accelerating member 550 slightly, and the accelerating protrusions 551 are caught in the inner walls of the angle limiting portions 452 such that the cam follower 450 does not rotate any more. The remaining configuration of the accelerating protrusions 551 and the angle limiting portions 452 excluding the above configuration is the same as FIGS. 1 through 7A and 7B. If rollers 451 of the cam follower 450 roll along cam protrusions 310 in a state where the angle limiting portions 452 are caught in the accelerating protrusions 551 and the cam follower 450 cannot rotate, the angle limiting portions 452 are pushed by the accelerating protrusions 551 so that the cam follower 450 rotates with respect to the accelerating member 550. As such, the relative speed between the rollers 451 and the cam member 300 increases, and the valve rod 210 may descend at high speed.

In the present embodiment, eight cam protrusions 310 and two rollers 420 are disposed. However, the number of cam protrusions 310 and the number of rollers 420 may be diverse. The shape of the cam protrusions 310 may vary according to their inclined angles and curvatures of inclined surfaces.

As described above, in a valve accelerating type dispensing pump according to the present invention, an accurate amount of a liquid may be dispensed at high speed.

Also, the valve accelerating type dispensing pump according to the present invention may dispense a liquid having high viscosity at high speed due to a fast descending speed of a valve rod.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A liquid dispensing pump comprising:
   a pump body;
   a valve body comprising an inlet path to which liquid is supplied, a reservoir in which the liquid supplied via the inlet path is to be stored, and a discharge path through which the liquid stored in the reservoir is discharged, the valve body being installed at the pump body;
   a valve rod configured to pressurize the liquid stored in the reservoir of the valve body so that the liquid is discharged via the discharge path;
   an operating rod connected to the valve rod and configured to drive the valve rod to move relative to the valve body;
   a cam member comprising a through hole through which the operating rod passes and further comprising cam protrusions formed around the through hole, the cam protrusions having inclined surfaces on which a cam follower travels, the cam member being installed at the pump body and rotatable about a rotation axis;
   the cam follower comprising rollers configured to roll on the inclined surfaces of the cam protrusions when the cam member rotates, the cam follower coupled to the operating rod and configured to drive the valve rod to move relative to the valve body;
   a can follower retainer engaged with the cam follower while permitting angular movement of the cam follower relative to the cam follower retainer about the rotation axis within a predetermined angular rang; and the cam follower retainer integrated with the pump body and linearly movable toward the cam member; and an elastic member installed between the pump body and the cam follower retainer and configured to provide an elastic force to the cam follower retainer for pressing the cam follower retainer toward the cam member.

2. The pump of claim 1, wherein projections are formed to protrude from one of the cam follower and the cam follower retainer, and angle limiting portions are formed on the other one of the cam follower and the cam follower retainer and configured to limit the angular movement of the cam follower relative to the cam follower retainer by interference between the projections and the angle limiting portions.

3. The pump of claim 2, wherein the projections are formed on the cam follower and have a shape of rods that extend from the cam follower, and the angle limiting portions are formed on the cam follower retainer and have a shape of grooves or holes in which the projections are inserted and which are configured to limit the angular movement of the cam follower relative to the cam follower retainer within a circumferential length of the grooves or holes.

4. The pump of claim 3, wherein the projections of the cam follower comprise a bearing configured to roll on inner walls of the angle limiting portion.

5. The pump of claim 4, wherein the rollers of the cam follower are installed at the projections.

6. The pump of claim 2, wherein the angle limiting portions are grooves that are formed in a circular arc along a circumferential direction of the cam follower, and the projections are rods that are inserted in the grooves.

7. The pump of claim 1, wherein the cam protrusions of the cam member are arranged at the same angle intervals.

8. The pump of claim 7, wherein the cam member comprises an even number of cam protrusions, and the cam follower comprises two rollers at intervals of 180 degrees.

9. The pump of claim 8, wherein each of the cam protrusions of the cam member comprises the inclined surface ascending along a circumferential direction of the cam member at constant inclination, and further comprises another surface descending parallel to the rotation axis of the cam member.

10. The pump of claim 8, wherein the cam follower is angularly movable with respect to the cam follower retainer within a range of an angle that is less than an angle between the adjacent cam protrusions and greater than 0 degrees.

11. The pump of claim 1, further comprising a rotating unit which is configured to rotate the cam member and comprises a driven pulley connected to the cam member to rotate the cam member, a driving pulley installed at the pump body, a belt connecting the driving pulley and the driven pulley, and a motor that is configured to rotate the driving pulley.

* * * * *

UNITED STATES PATENT AND TRADEMARK OFFICE
CERTIFICATE OF CORRECTION

PATENT NO. : 8,936,181 B2  
APPLICATION NO. : 13/725720  
DATED : January 20, 2015  
INVENTOR(S) : Seung Min Hong et al.

Page 1 of 1

It is certified that error appears in the above-identified patent and that said Letters Patent is hereby corrected as shown below:

In the Specification

Column 1, Line 8, change "May 24," to --May 24, 2012--.

Column 4, Line 59, change "FIG." to --FIG. 1--.

In the Claims

Column 8, Line 66, Claim 1, change "can" to --cam--.

Column 9, Line 2, Claim 1, change "rang;" to --range,--.

Signed and Sealed this  
Twenty-second Day of September, 2015

Michelle K. Lee  
*Director of the United States Patent and Trademark Office*